(12) United States Patent
Paul et al.

(10) Patent No.: US 9,413,406 B2
(45) Date of Patent: Aug. 9, 2016

(54) SINGLE INPUT MULTIPLE-OUTPUT POWER AMPLIFIER

(71) Applicant: QUALCOMM Incorporated, San Diego, CA (US)

(72) Inventors: Susanne Paul, Austin, TX (US); Marius Goldenberg, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/656,543

(22) Filed: Mar. 12, 2015

(65) Prior Publication Data

US 2015/0263769 A1 Sep. 17, 2015

Related U.S. Application Data

(60) Provisional application No. 61/953,473, filed on Mar. 14, 2014.

(51) Int. Cl.
*H04B 1/18* (2006.01)
*H03F 3/189* (2006.01)
*H03F 3/21* (2006.01)

(52) U.S. Cl.
CPC .................. *H04B 1/18* (2013.01); *H03F 3/189* (2013.01); *H03F 3/211* (2013.01)

(58) Field of Classification Search
CPC .......... H04B 1/02; H04B 1/04; H04B 1/0458; H04B 1/0483
See application file for complete search history.

(56) References Cited

U.S. PATENT DOCUMENTS

| 5,541,554 | A | 7/1996 | Stengel et al. | |
|---|---|---|---|---|
| 7,324,799 | B2 * | 1/2008 | Vaara | H03D 7/1433 327/359 |
| 8,461,931 | B1 * | 6/2013 | Bayruns | H03F 1/0244 330/127 |
| 8,903,343 | B2 | 12/2014 | Holenstein et al. | |
| 2005/0030094 | A1 | 2/2005 | Conrad et al. | |
| 2010/0127780 | A1 | 5/2010 | An et al. | |
| 2010/0291888 | A1 * | 11/2010 | Hadjichristos | H03F 1/0277 455/127.4 |
| 2011/0115565 | A1 * | 5/2011 | Cabanillas | H03F 1/0277 330/307 |
| 2011/0187451 | A1 * | 8/2011 | Yoon | H03F 3/195 330/117 |
| 2012/0075023 | A1 | 3/2012 | Guo | |
| 2012/0087282 | A1 * | 4/2012 | Shibahara | H03F 1/0277 370/277 |
| 2012/0188011 | A1 | 7/2012 | Retz et al. | |
| 2013/0237284 | A1 | 9/2013 | Yeh et al. | |
| 2013/0285749 | A1 * | 10/2013 | Kamitani | H03F 1/0277 330/295 |
| 2013/0316670 | A1 | 11/2013 | Tasic et al. | |

(Continued)

OTHER PUBLICATIONS

Annex Form PCT/ISA/206 issued in co-pending PCT application No. PCT/US2015/020450 on Jul. 2, 2015 in 8 pages.

(Continued)

*Primary Examiner* — Nguyen Vo
(74) *Attorney, Agent, or Firm* — Procopio, Cory, Hargreaves & Savitch, LLP (57) ABSTRACT

An RF amplifier, including: an input RF chain configured to receive and process an input RF signal including a plurality of frequency bands within a first band group and output a first signal; and a plurality of output RF chains coupled to the input RF chain, each output RF chain of the plurality of output RF chains configured to process the first signal within at least one band of the plurality of frequency bands of the first band group, wherein each output RF chain includes a bias circuit configured to receive an enable signal to enable the processing of the first signal within the at least one band and output an output RF signal within the at least one band.

16 Claims, 9 Drawing Sheets

(56) References Cited

U.S. PATENT DOCUMENTS

| | | |
|---|---|---|
| 2014/0015607 A1 | 1/2014 | Li et al. |
| 2014/0113578 A1 | 4/2014 | Xu et al. |
| 2015/0015329 A1 | 1/2015 | Wilson et al. |

OTHER PUBLICATIONS

International Search Report and Written Opinion—PCT/US2015/020450—ISA/EPO—Oct. 28, 2015.

* cited by examiner

SINGLE INPUT MULTIPLE-OUTPUT POWER AMPLIFIER

CROSS-REFERENCE TO RELATED APPLICATIONS

This application claims the benefit of priority under 35 U.S.C. §119(e) of co-pending U.S. Provisional Patent Application No. 61/953,473, filed Mar. 14, 2014, entitled "Single-Input Multiple-Output RF Power Amplifier." The disclosure of the above-referenced application is incorporated herein by reference.

BACKGROUND

1. Field

This disclosure relates generally to power amplifiers, and more specifically, to a power amplifier having a single input RF chain that is directly coupled with a plurality of parallel output RF chains.

2. Background

Modern mobile communication devices are designed with a requirement that they function correctly in as many mobile communication networks as possible. These networks may or may not be geographically distinct and may be governed by a plurality of modulation standards and operate in a plurality of frequency bands. One way to satisfy this requirement is for the mobile communication device to include multiple RF signal paths, wherein each RF path is dedicated to the support of a given communication standard and/or frequency band.

Market pressure for miniaturization and cost reduction of mobile communication devices is driving the RF architecture towards an approach that minimizes the number of independent RF signal paths. The constant rise of computing power and digital signal processing have naturally allowed for the merger of multiple modulation standards within a single transceiver baseband chip. Similarly, improvements in the performance of CMOS devices provides for the ability to design RF transceivers capable of operating in multiple frequency bands. However, maintaining a single RF signal path from the output of the single transceiver to the single antenna cannot yet be achieved because efficient RF Power Amplifiers (PAs) require accurately tuned, narrow band, high quality matching networks, followed by different bandpass filters for the various frequency bands that need to be supported by the communication device.

Figure 1:
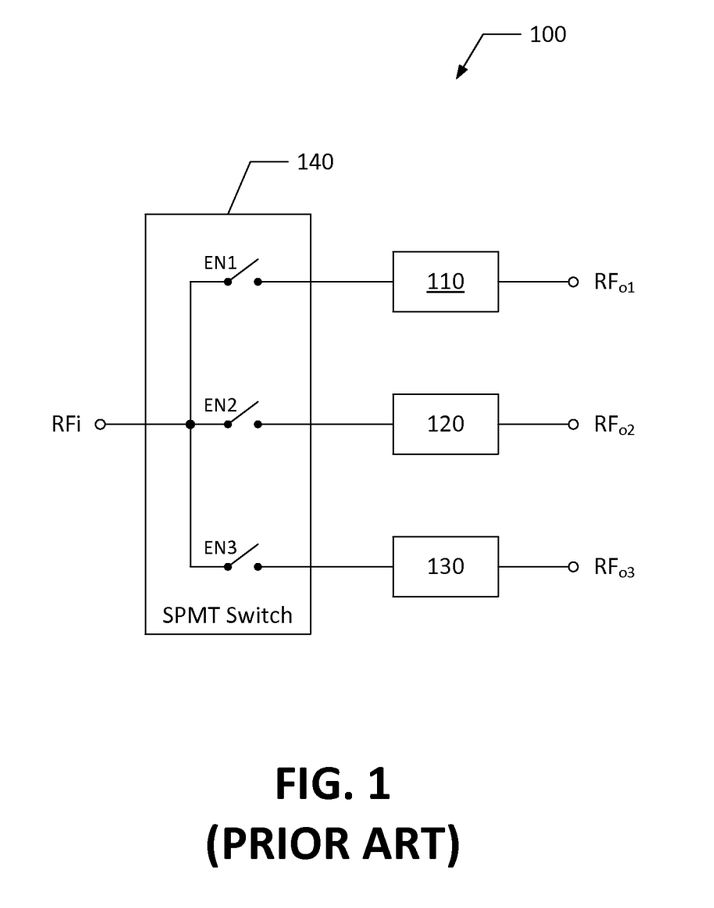
FIG. 1 is a block diagram showing multiple power amplifiers (PAs) driven by a single transceiver by means of a single-pole multi-throw (SPMT) switch.

FIG. 1 shows multiple PAs 110, 120, 130 driven by a single transceiver by means of a single-pole multi-throw (SPMT) switch 140. The need to replicate the entire RF signal path for each frequency band, starting from the output of the transceiver and continuing to the antenna input, is not conducive to the achievement of significant reduction in cost and physical dimensions.

Figure 2:
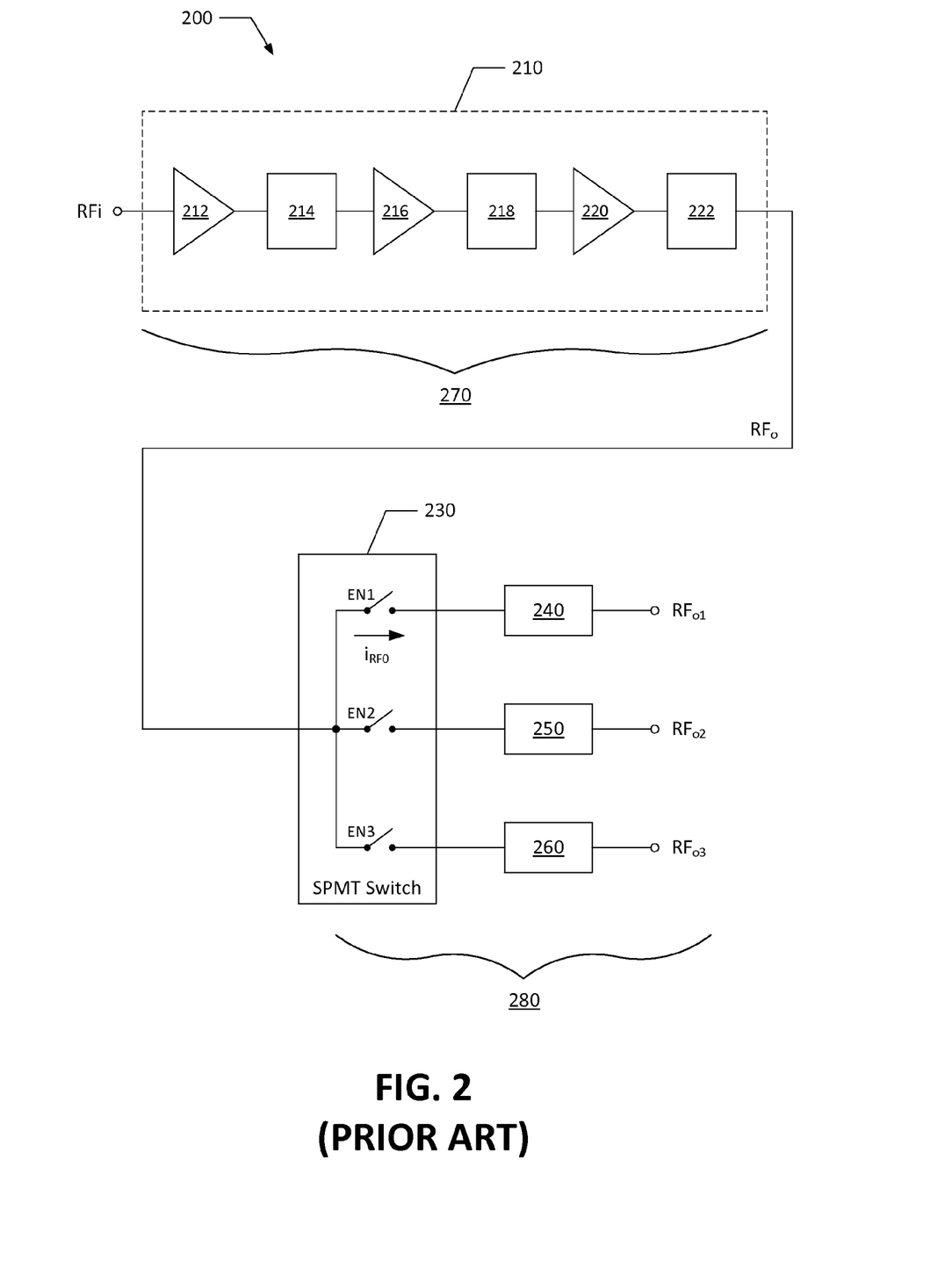
FIG. 2 is a block diagram showing a single integrated PA followed by an SPMT switch coupled to the output of the PA.

FIG. 2 shows a single integrated PA 210 followed by an SPMT switch 230 coupled to the output of the PA ($RF_o$). The PA 210 includes a stage-3 power driver 212, a stage-3 match circuit 214, a stage-2 power driver 216, a stage-2 match circuit 218, a stage-1 power driver 220, and a stage-1 match circuit 222. However, a PA, using a single transformation network, cannot produce an efficient RF amplification at multiple frequencies because of the combination of the transformation network's narrow-band characteristic and carefully-adjusted reactive elements. One solution is to place independent corrective reactive networks 240, 250, 260 following the SPMT switch 230, one network 240, 250, or 260 for each separate frequency band RF signal path. Thus, when selected, each frequency band RF path operates as a PA terminated on a two-stage transformation network, wherein the first stage 270 is shared among all bands and the second stage 280 is uniquely associated with the currently selected band. While this approach achieves the goal of leveraging a single PA among many frequency bands, it has several disadvantages. One of them is that the switch implementation requires a special high-voltage semiconductor process that delivers transistors capable of tolerating such voltages (e.g., $RF_o$).

SUMMARY

The present disclosure describes a power amplifier (PA) including a single input RF chain that is directly coupled with a plurality of parallel output RF chains, wherein PA band of operation is selected using enable signals that control the state of bias circuits of power drivers in the plurality of parallel output RF chains.

In one embodiment, a radio frequency (RF) amplifier is disclosed. The RF amplifier includes: an input RF chain configured to receive and process an input RF signal including a plurality of frequency bands within a first band group and output a first signal; and a plurality of output RF chains coupled to the input RF chain, each output RF chain of the plurality of output RF chains configured to process the first signal within at least one band of the plurality of frequency bands of the first band group, wherein each output RF chain includes a bias circuit configured to receive an enable signal to enable the processing of the first signal within the at least one band and output an output RF signal within the at least one band.

In another embodiment, an apparatus is disclosed. The apparatus includes: means for receiving an input RF signal including a plurality of frequency bands within a first band group; means for processing the input RF signal and outputting a first signal; and plural means for processing and outputting coupled to the means for processing the input RF signal, each means for processing and outputting configured to process the first signal within at least one band of the plurality of frequency bands of the first band group, wherein the each means for processing and outputting receives an enable signal to enable the processing of the first signal within the at least one band and output an output RF signal within the at least one band.

In yet another embodiment, an apparatus is disclosed. The apparatus includes: an input RF chain configured to receive and process an input RF signal including a plurality of frequency bands within a first band group and output a first signal; and a plurality of output RF chains coupled to the input RF chain, each output RF chain of the plurality of output RF chains configured to process the first signal within at least one band of the plurality of frequency bands of the first band group, wherein each output RF chain includes a bias circuit and an active gain element, wherein the bias circuit is configured to receive an enable signal and to output an output RF signal within the at least one band, wherein the active gain element is configured to be turned on by the bias circuit to process the first signal within the at least one band when the enable signal is received by the bias circuit.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

Exposure to the large RF voltages imposes difficult constraints on the design of the switch, which translates into manufacturing costs. As stated above, the switch implementation requires a special high-voltage semiconductor process that delivers transistors capable of tolerating such voltages including gallium arsenide (GaAs) field-effect transistors and transistors using silicon-on-insulator/sapphire (SOI/SOS) technologies. Further, the large voltage swings create significant non-linear responses from various parasitic elements, like junction capacitances, present in the design. Such non-linear responses generate unwanted out-of-band signals that can greatly degrade the performance of the RF signal path. One way to mitigate the disadvantage caused by the high-voltage requirements placed on the SPMT switch (e.g., switch 230 in FIG. 2) is to embed the SPMT switch inside the integrated PA.

Figure 3:
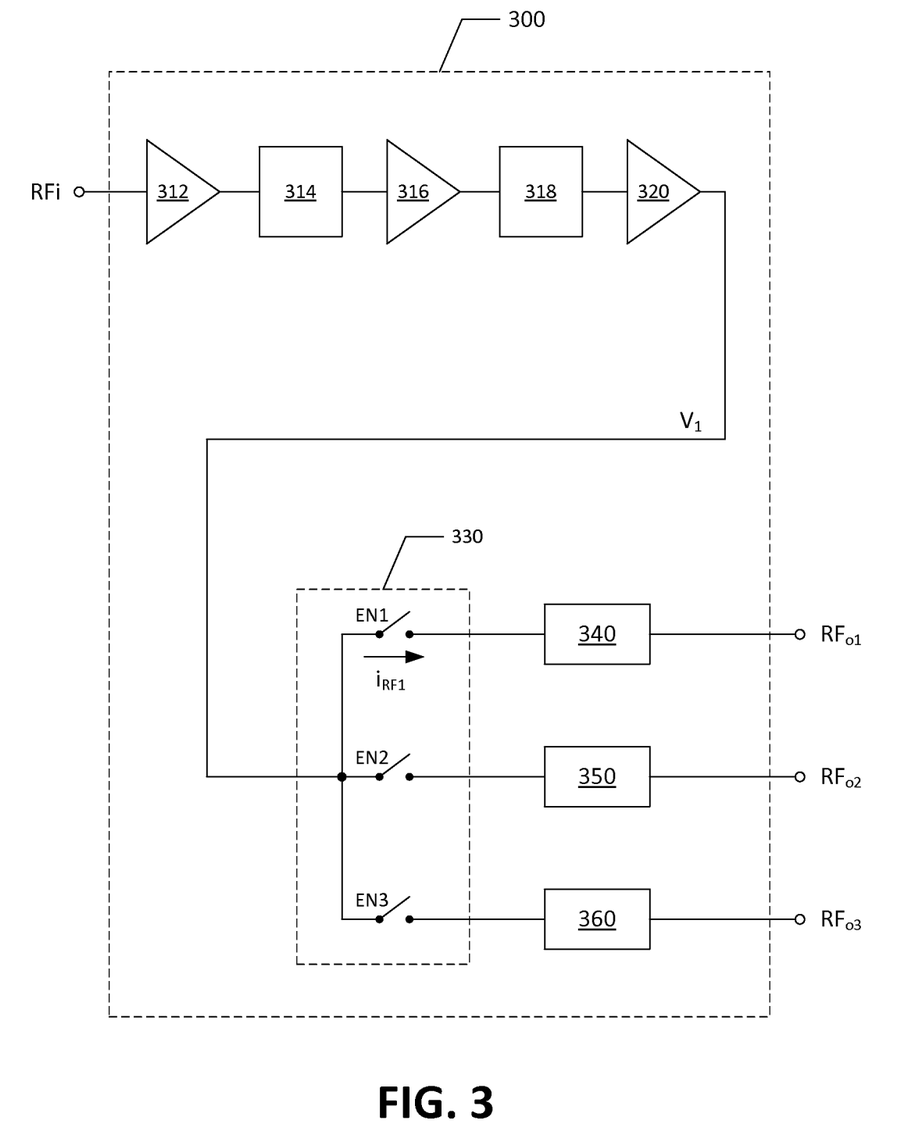
FIG. 3 is a functional block diagram of a single-input multiple-output (SIMO) radio frequency (RF) power amplifier (PA) in accordance with one embodiment.

FIG. 3 is a block diagram of a single-input multiple-output (SIMO) RF power amplifier (PA) 300 in accordance with one embodiment. The PA 300 includes a stage-3 power driver 312, a stage-3 match circuit 314, a stage-2 power driver 316, a stage-2 match circuit 318, and a stage-1 power driver 320. In the illustrated embodiment of FIG. 3, the SPMT switch 300 is placed at the output of the stage-1 power driver 320, in front of the output match circuits 340, 350, 360. The voltage swing at the output of the stage-1 power driver 320 ($V_1$) is several times smaller than the voltage swing ($RF_o$ in FIG. 2) at the output of the PA and it is compatible to the semiconductor process technology used in the implementation of the PA itself. A significant advantage of the configuration in FIG. 3 over the configuration of FIG. 2 is that each independent transformation network can be optimized for its frequency band. One disadvantage of the configuration of FIG. 3 is the efficiency reduction due to insertion loss and due to the switch parasitic capacitances that impose changes of the transformation networks. Another disadvantage of this approach is the implementation complexity related to the DC coupling of the output of the stage-1 power driver 320 and the SPMT switch 330.

Figure 4:
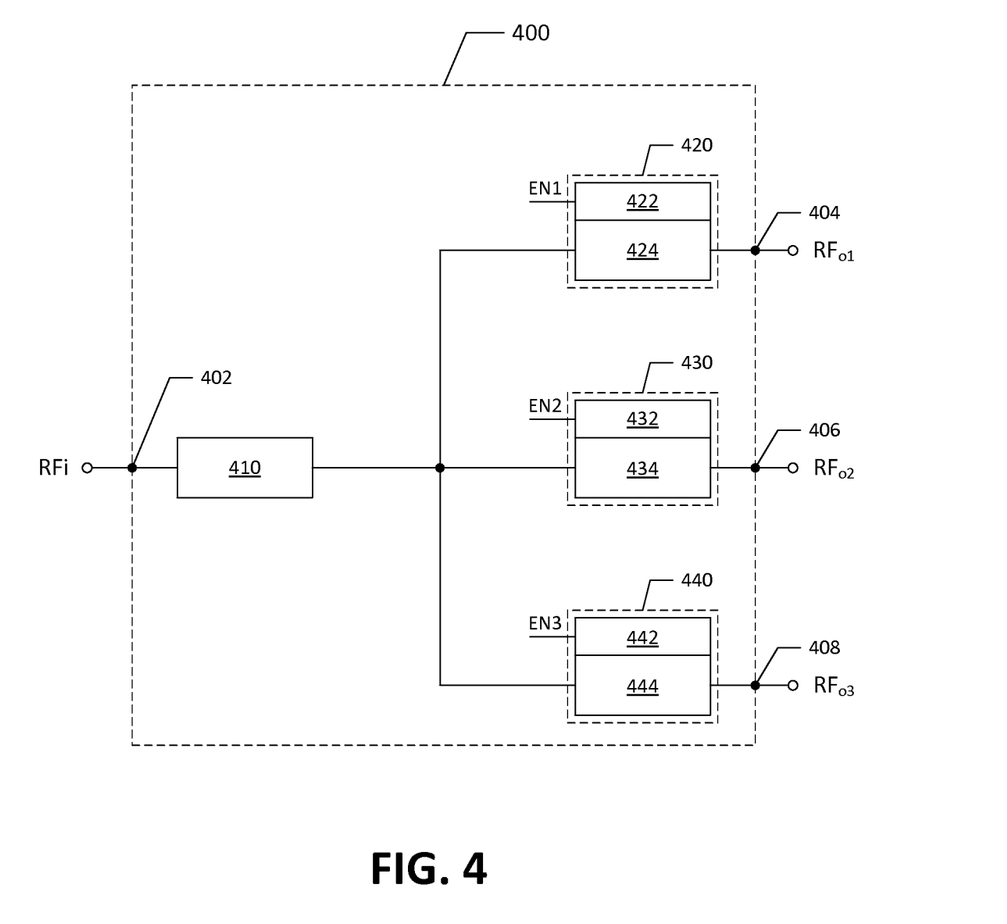
FIG. 4 is a functional block diagram of a SIMO RF PA in accordance with another embodiment.

FIG. 4 is a functional block diagram of a SIMO RF PA 400 in accordance with another embodiment. The PA 400 of FIG. 4 substantially reduces disadvantages present in the configuration of FIG. 3. In the illustrated embodiment of FIG. 4, the SIMO RF PA 400 receives an input RF signal ($RF_i$) at node 402 and outputs a plurality of output RF signals ($RF_{o1}$, $RF_{o2}$, $RF_{o3}$) at nodes 404, 406, 408. The SIMO RF PA 400 includes a single input RF chain 410 that is directly coupled with a plurality of parallel output RF chains 420, 430, 440 (in contrast to using SPMT switch 330 in FIG. 3). In one embodiment, the input RF chain 410 can include a stage-3 power driver, a stage-3 match circuit, a stage-2 power driver, a stage-2 match circuit, and a stage-1 power driver, similar to the input chain 312, 314, 316, 318, 320 which produces $V_1$. The input RF chain 410 is shared among all supported frequency bands. Each output RF chain 420, 430, or 440 is independently optimized for its particular frequency band of operation (e.g., low band, mid band, high band) as well as any other communication standard requirements, such as maximum output power. Each output RF chain 420, 430, or 440 comprises one or more active gain stages 424, 434, or 444, which is turned on or off by controlling its associated bias circuit 422, 432, or 442 to an on state or an off state using enable signal EN1, EN2, or EN3.

Figure 5:
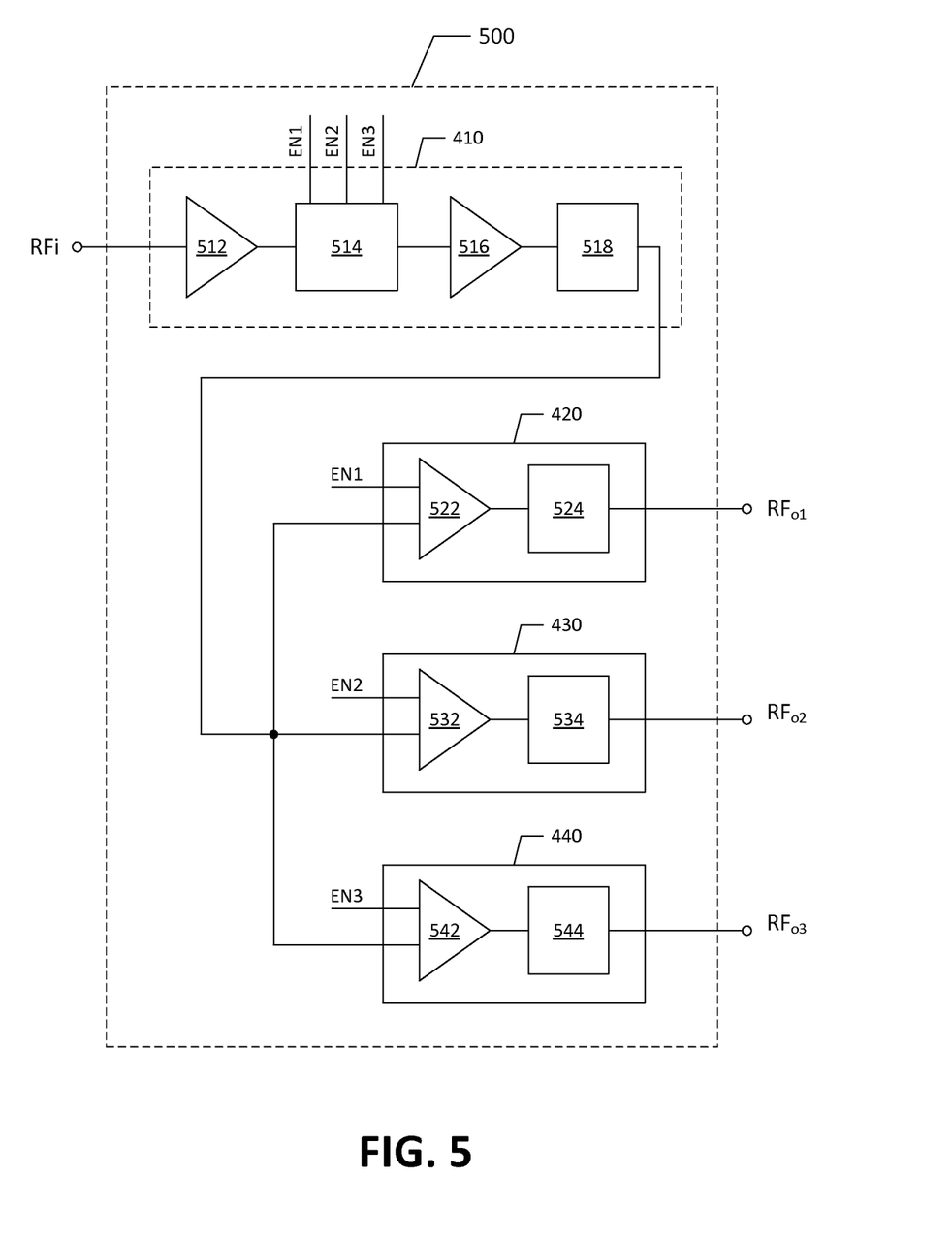
FIG. 5 is a detailed functional block diagram of a SIMO RF PA in accordance with one embodiment.

FIG. 5 is a detailed block diagram of a SIMO RF PA 500 which shows the units within blocks 410, 420, 430, 440 of FIG. 4 in accordance with one embodiment. In the illustrated embodiment of FIG. 5, the input RF chain 410 includes a stage-3 power driver 512, a stage-3 match circuit 514, a stage-2 power driver 516, and a stage-2 match circuit 518. The input RF chain 410 receives the input RF signal RFi to be amplified. Each output RF chain 420, 430, or 440 includes a stage-1 power driver and a stage-1 match circuit. In particular, the output RF chain 420 includes a stage-1 power driver 522 and a stage-1 match circuit 524; the output RF chain 430 includes a stage-1 power driver 532 and a stage-1 match circuit 534; and the output RF chain 440 includes a stage-1 power driver 542 and a stage-1 match circuit 544. Accordingly, the configuration of FIG. 5 uses multiple stage-1 RF power drivers (one per supported band) rather than using just one stage-1 RF power driver followed by a large SPMT switch for all RF bands (as shown in FIG. 3).

In the illustrated embodiment of FIG. 5, each of the output RF chains 420, 430, 440 includes a stage-1 power driver 522, 532, or 534, which also functions as a bias circuit (similar to bias circuit 422, 432, or 442) and receives enable signal EN1, EN2, or EN3. For example, in one embodiment, the stage-1 power driver 522 is configured with a power transistor having a bias point controlled by enable signal EN1. Similarly, the stage-1 power driver 532 is configured with a power transistor having a bias point controlled by enable signal EN2, and the stage-1 power driver 542 is configured with a power transistor having a bias point controlled by enable signal EN3. In other embodiments, the stage-1 power driver 522, 532, or 534 is configured with a power amplifier having a bias input configured to receive enable signal EN1, EN2, or EN3. In FIG. 5, each of the output RF chains 420, 430, 440 also includes a stage-1 match circuit 524, 534, 544, which, along with the stage-1 power driver 522, 532, or 534, functions as one or more active gain stage (similar to bias circuit 424, 434, or 444). Thus, the active gain stage is turned on or off by controlling its associated bias circuit to an on state or an off state using enable signal EN1, EN2, or EN3.

The silicon area used for the configuration of FIG. 5 is smaller than the area used for the configuration of FIG. 3. For example, three parallel output RF chains would use three times the silicon area of the output driver of a single output PA. Each independent power driver is directly coupled to its dedicated transformation network, thus substantially reducing power loss factors related to the SPMT switch and its related non-linearity. The stage-1 RF power drivers 522, 532, 542 can be made inactive by means of controlling the associated DC bias circuits into a power-down state. Thus, the function of an SPMT switch can be realized by selectively enabling only one of the multiple stage-1 RF power drivers 522, 532, 542 at a time. In FIG. 5, enable signals EN1, EN2, EN3 directly control the state of bias circuits of the power drivers, where an asserted enable signal controls the corresponding bias circuit in the power-up state, and a de-asserted enable signal controls the corresponding bias circuit in the power-down state. The output RF signals RFo1, RFo2, RFo3 are supplied to circuits that forward them to the antenna for transmission.

In FIG. 5, stage-1 RF power drivers 522, 532, 542 are connected in parallel to the output of the stage-2 match circuit 518. Although this configuration of FIG. 5 provides significant advantage over the configuration of FIG. 3, this configuration can impose an additional capacitive load to the stage-2 match circuit 518, which leads to a reduction in gain and increase of the DC bias current of stage-2. However, the impact on the overall efficiency of the PA 500 is small (approximately 1%). Further, the input RF chain 410 (starting from RFi and ending at the output of stage-2 match circuit 518) is shared among all supported bands and needs to operate in a wide range of frequencies imposed by the multiple supported bands. However, each matching network includes resonant circuits that work optimally in a relatively narrow band around a chosen center frequency. One way to optimize the performance of a matching network across multiple frequencies is to employ selectable tuning, where the tuning control signals are the same enable signals that control the choice of the PA band of operation.

Accordingly, the enable signals EN1, EN2, EN3 are also coupled to the stage-3 match circuit 514 for the purpose of tuning.

Figure 6:
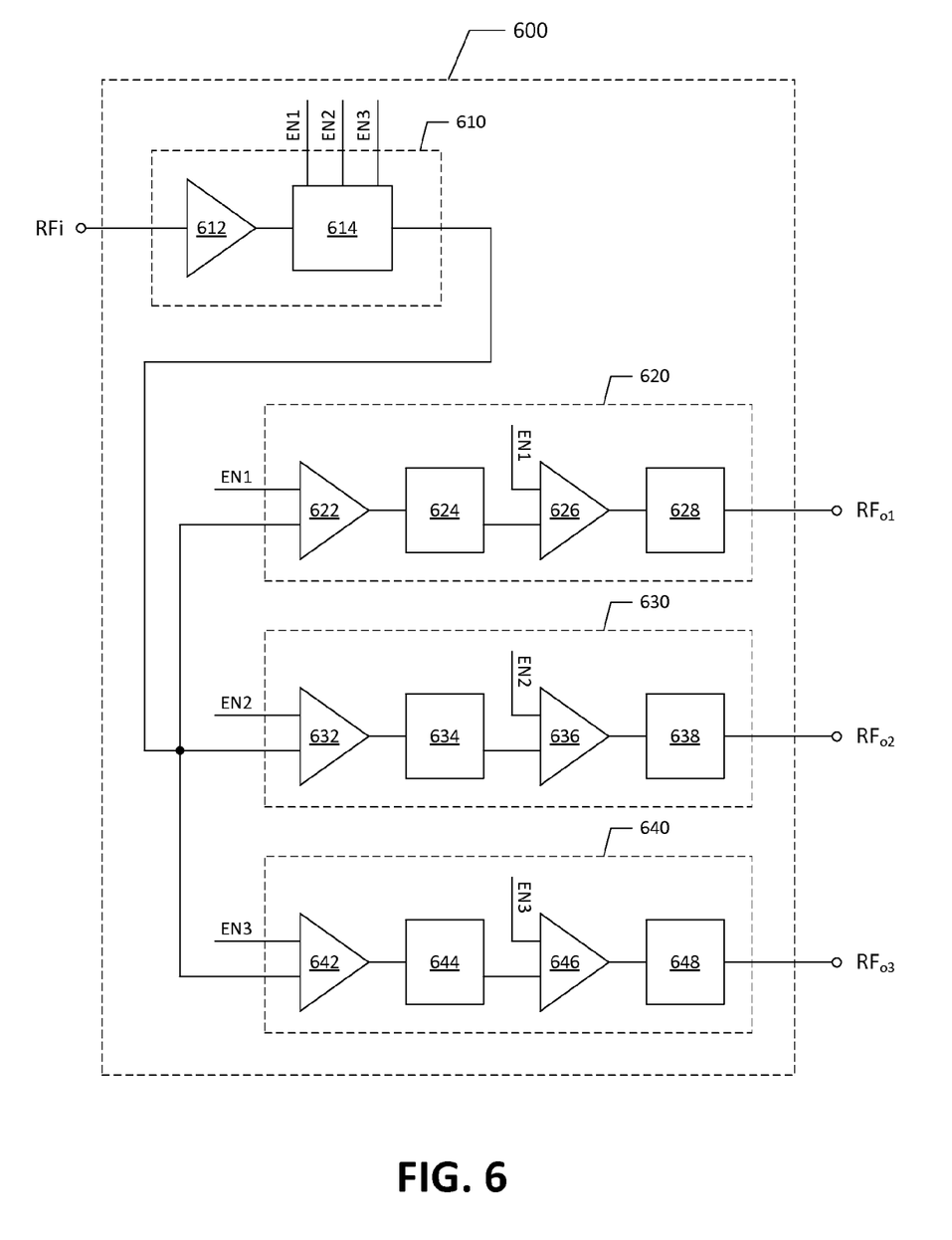
FIG. 6 is a detailed functional block diagram of a SIMO RF PA in accordance with another embodiment.

FIG. 6 is a detailed block diagram of a SIMO RF PA 600 in accordance with another embodiment. The illustrated embodiment shown in FIG. 6 substantially reduces the disadvantages described-above related to the lack of stage-2 match tuning by moving the switching function in front of the stage-2. In the illustrated embodiment of FIG. 6, the input RF chain 610 includes a stage-3 power driver 612 and a stage-3 match circuit 614. Each independent output RF chain 620, 630, or 640 includes a stage-2 power driver, a stage-2 match circuit, a stage-1 power driver and a stage-1 match circuit. In particular, the output RF chain 620 includes a stage-2 power driver 622, a stage-2 match circuit 624, a stage-1 power driver 626, and a stage-1 match circuit 628; the output RF chain 630 includes a stage-2 power driver 632, a stage-2 match circuit 634, a stage-1 power driver 636, and a stage-1 match circuit 638; and the output RF chain 640 includes a stage-2 power driver 642, a stage-2 match circuit 644, a stage-1 power driver 646, and a stage-1 match circuit 648. The switching function is performed by controlling the state of the DC bias circuits of the stage-2 power drivers 622, 632, 642 and the stage-1 power drivers 626, 636, 646 in a manner similar to the control of the DC bias circuits of the stage-1 power drivers 522, 532, 542 in the configuration of FIG. 5. In the configuration of FIG. 6, all stage-2 circuits 622, 632, 642 are connected in parallel to the output of the stage-3 match circuit 614. This imposes an additional capacitive load to the stage-3 match, which leads to a reduction in gain. This can be compensated by an increase in the stage-3 DC bias current, which will have only a minimal impact on the overall efficiency of the PA.

Figure 7:
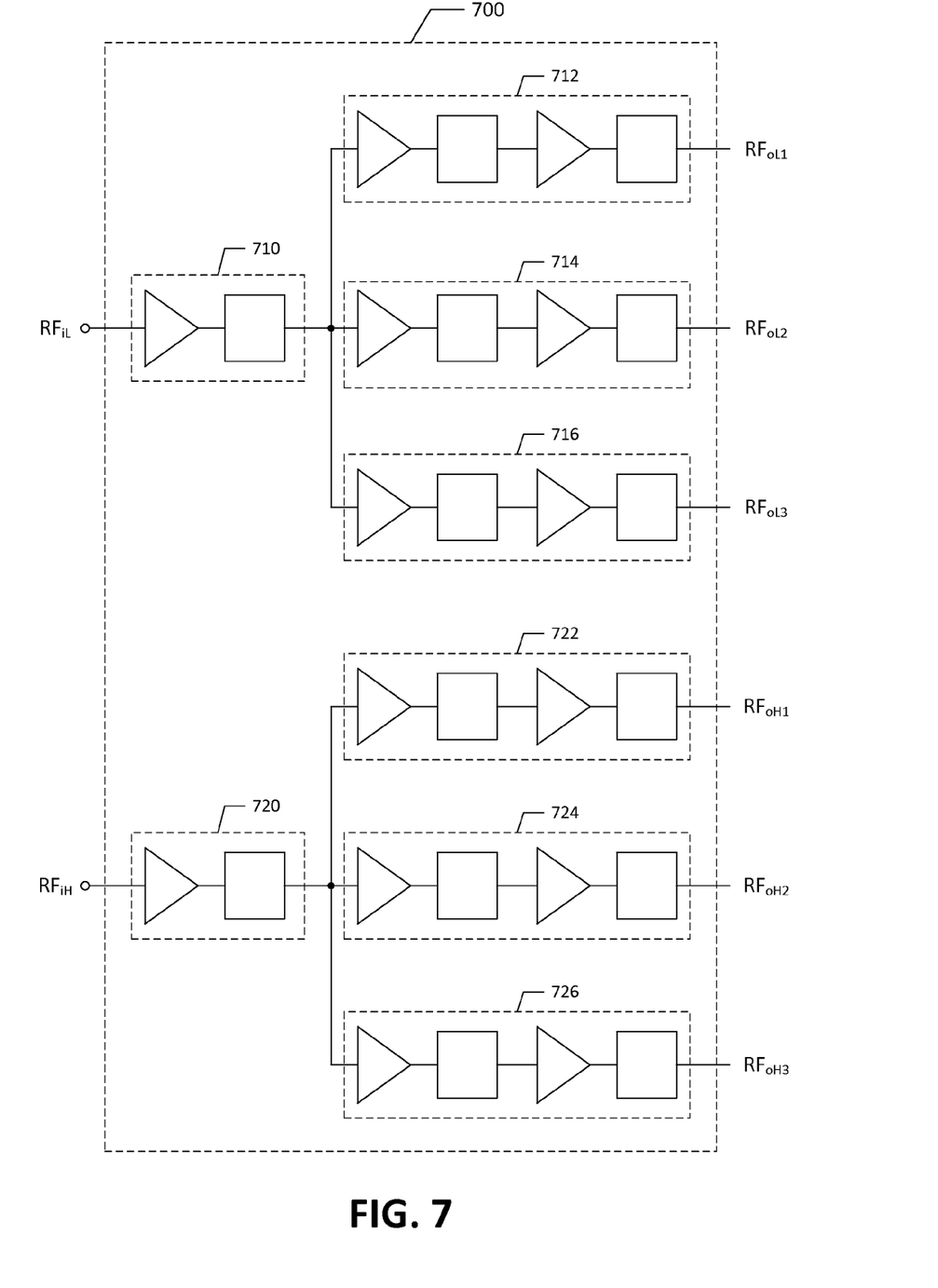
FIG. 7 is a functional block diagram illustrating an example of an integrated PA including more than one input RF chain in accordance with one embodiment.

Frequency bands handled by a given PA input signal chain are clustered within a few hundred megahertz from each other. However, to handle frequency bands separated by one or more gigahertz, multiple PA input signal paths are needed on the same integrated PA device. FIG. 7 is a block diagram illustrating an example of such an integrated PA 700 in accordance with one embodiment. The integrated PA 700 of FIG. 7 is configured to process six frequency bands divided into two groups, a low band group of frequency bands (L band group) and a high band group of frequency bands (H band group). Each group of frequency bands comprises bands located within a few hundred megahertz from each other. However, the bands within the L band group are located more than one gigahertz away from the bands within the H band group.

In the illustrated embodiment of FIG. 7, the three bands in the L band group of the input signal ($RF_{iL}$) are processed by an input RF chain 710 and three output RF chains 712, 714, 716, while the three bands in the H band group of the input signal ($RF_{iH}$) are processed by an input RF chain 720 and three RF chains 722, 724, 726. Thus, the RF output signals, $RF_{oL1}$, $RF_{oL2}$, $RF_{oL3}$, are located within a few hundred megahertz from each other, and the RF output signals, $RF_{oH1}$, $RF_{oH2}$, $RF_{oH3}$, are also located within a few hundred megahertz from each other, while the RF output signals, $RF_{oL1}$, $RF_{oL2}$, $RF_{oL3}$, are all located more than one gigahertz from the RF output signals, $RF_{oH1}$, $RF_{oH2}$, $RF_{oH3}$.

The bands handled by an RF input chain need not comprise an identical number of frequency bands. Thus, the output power requirement for any one band can be designed to be different from any other band because of the independent RF signal path through stage-2 and stage-1. Further, the output power requirement for any given band can be designed to change depending on which mobile communication standard needs to be served.

Figure 8:
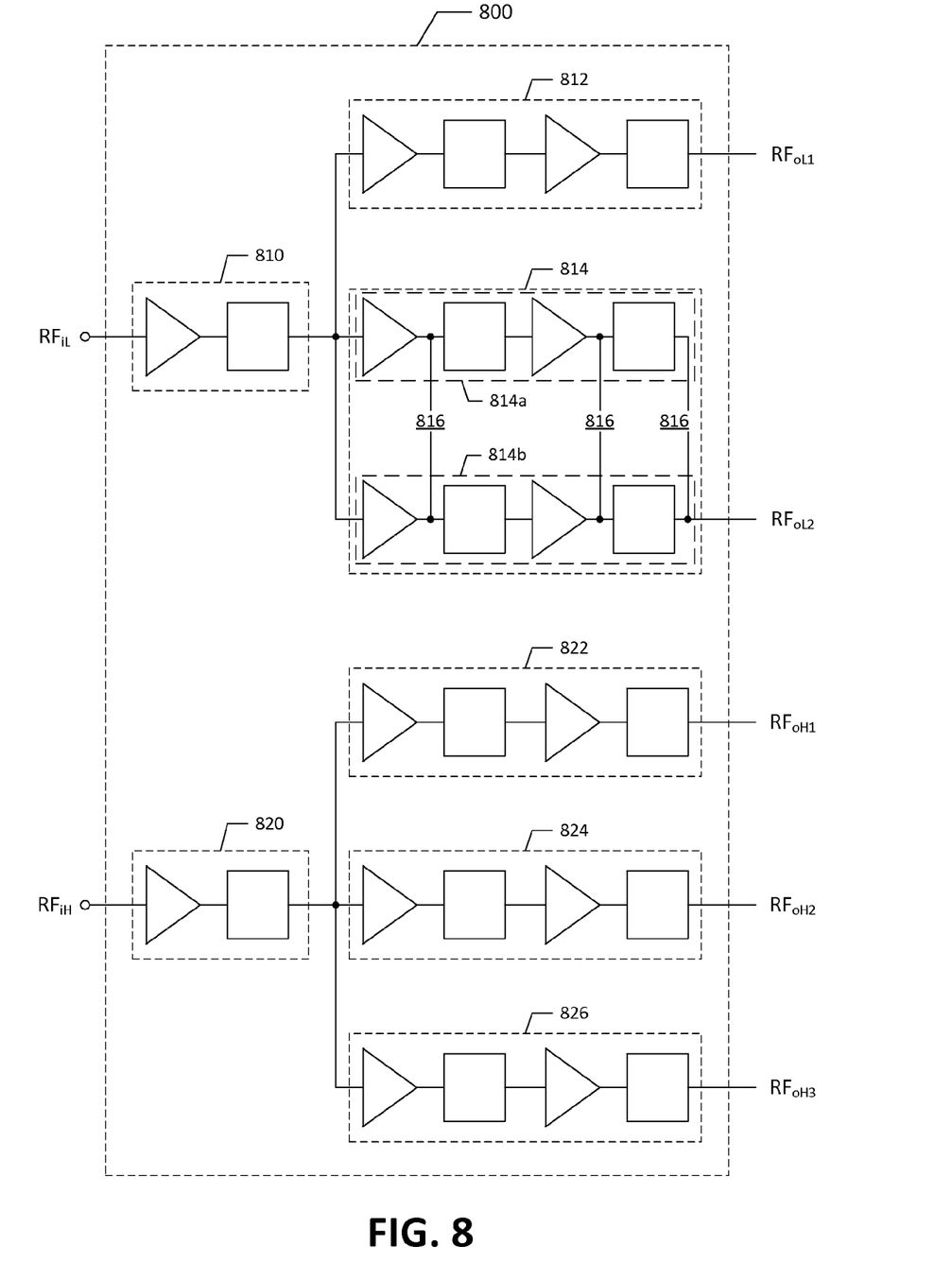
FIG. 8 is a functional block diagram illustrating an example of an integrated PA including more than one input RF chain in accordance with another embodiment.

FIG. 8 is a block diagram illustrating an integrated PA 800 in accordance with an alternative embodiment. In FIG. 8, the integrated PA 800 is configured to process five frequency bands having two frequency bands in the L band group and three frequency bands in the H band group. Thus, the two bands in the L band group of the input signal ($RF_{iL}$) are processed by an input RF chain 810 and two output RF chains 812, 814, while the three bands in the H band group of the input signal ($RF_{iH}$) are processed by an input RF chain 820 and three RF chains 822, 824, 826. The two output RF chains 812, 814 for the L band group output two RF output signals, $RF_{oL1}$, $RF_{oL2}$, while the three output RF chains 822, 824, 826 for the H band group output three RF output signals, $RF_{oH1}$, $RF_{oH2}$, $RF_{oH3}$. Accordingly, for the RF output chain 814, two RF signal paths 814a, 814b can be tied together (shown as 816 in FIG. 8) to accomplish an approximately 3-dB output power increase.

Figure 9:
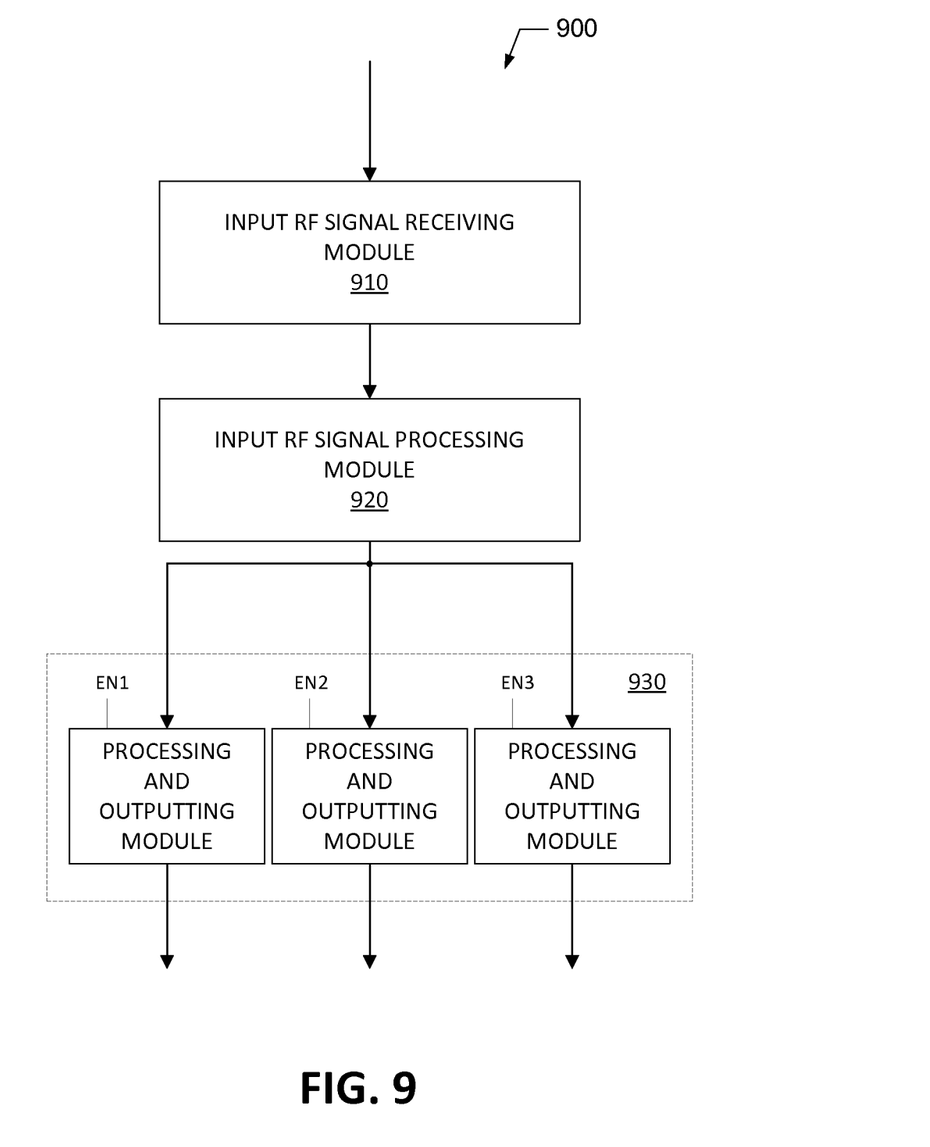
FIG. 9 is a functional block diagram of an apparatus configured to receive an input RF signal and generate a plurality of output RF signals in accordance with one embodiment.

FIG. 9 is a block diagram of an apparatus 900 configured to receive an input RF signal and generate a plurality of output RF signals in accordance with one embodiment of the present disclosure. The apparatus 900 includes an input RF signal receiving module 910 tuned to a plurality of frequency bands within a first band group. The apparatus 900 also includes an input RF signal processing module 920. The apparatus 900 further includes a plurality of processing and outputting modules 930 coupled to the input RF signal processing module 920. Each of the plurality of processing and outputting modules 930 is configured to process the input RF signal within a particular frequency band of a band group. Each processing and outputting module within 930 also receives an enable signal to enable the processing of the input RF signal within the particular frequency band by a particular processing and outputting module within 930 to output an output RF signal within the particular frequency band.

Although several embodiments of the disclosure are described above, many variations of the disclosure are possible. For example, although the embodiment in the present disclosure describe having three (or two) bands within a band group and one (or two) band group(s), any number of bands within a band group and any number of band groups can be configured using the configurations described above. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A radio frequency (RF) amplifier, comprising:
an input RF chain configured to receive and process an input RF signal including a plurality of frequency bands within a first band group and output a first signal, wherein the input RF chain comprises a first power driver, a first match circuit, a second power driver, and a second match circuit; and
a plurality of output RF chains coupled to the input RF chain, each output RF chain of the plurality of output RF chains configured to process the first signal within at least one band of the plurality of frequency bands of the first band group,
wherein each output RF chain includes a third power driver and a third match circuit, the third power driver of each output RF chain is directly coupled to the second match circuit of the input RF chain.

2. The RF amplifier of claim 1, wherein the plurality of output RF chains is configured to process the first signal within the at least one band of the first band group and output a plurality of output RF signals within the first band group.

3. The RF amplifier of claim 1, wherein each output RF chain comprises a bias circuit configured to receive an enable signal to enable the processing of the first signal within the at least one band and output an output RF signal within the a least one band.

4. The RF amplifier of claim 3, wherein the bias circuit is configured to turn on the third power driver when the enable signal is received by the bias circuit.

5. The RF amplifier of claim 1, further comprising:
a second input RF chain configured to receive the input RF signal including a plurality of frequency bands within a second band group and output a second signal; and
a second plurality of output RF chains coupled to the second input RF chain, each output RF chain of the second plurality of output RF chains configured to process the second signal within at least one band of the second plurality of bands of the second band group.

6. The RF amplifier of claim 5, wherein at least two output RF chains of the second plurality of output RF chains are tied together.

7. The RF amplifier of claim 5, wherein the second input RF chain comprises a first power driver and a first match circuit.

8. The RF amplifier of claim 7, wherein each output RF chain of the second plurality of output RF chains comprises a second power driver, a second match circuit, a third power driver and a third match circuit, the second power driver of the each output RF chain of the second plurality of output RF chains is coupled to the first match circuit of the second input RF chain.

9. An apparatus, comprising:
means for receiving an input RF signal including a plurality of frequency bands within a first band group;
means for processing the input RF signal and outputting a first signal,
wherein the means for processing the input RF signal comprises a first power driver, a first match circuit, a second power driver, and a second match circuit; and
plural means for processing and outputting coupled to the means for processing the input RF signal, each means for processing and outputting configured to process the first signal within at least one band of the plurality of frequency bands of the first band group,
wherein each means for processing and outputting comprises a third power driver and a third match circuit, wherein the third power driver is directly coupled to the second match circuit of the means for processing the input RF signal.

10. The apparatus of claim 9, further comprising:
means for selecting means for processing and outputting from the plural means for processing and outputting; and
means for tuning the means for processing the input RF signal based on which means for processing and outputting from the plural means for processing and outputting is selected.

11. The apparatus of claim 9, further comprising
means for increasing an output power of each means for processing and outputting.

12. The apparatus of claim 11, wherein the means for increasing an output power comprises means for tying together at least two means for processing and outputting.

13. The apparatus of claim 9, wherein the means for processing the input RF signal is configured to receive enable signals that select one means for processing and outputting from the plural means for processing and outputting.

14. An apparatus comprising:
an input RF chain configured to receive and process an input RF signal including a plurality of frequency bands within a first band group and output a first signal, wherein the input RF chain comprises a first power driver and a first match circuit; and
a plurality of output RF chains coupled to the input RF chain, each output RF chain of the plurality of output RF chains configured to process the first signal within at least one band of the plurality of frequency bands of the first band group,
wherein each output RF chain comprises a second power driver, a second match circuit, a third power driver and a third match circuit, the second power driver of each output RF chain is directly coupled to the first match circuit of the input RF chain.

15. The apparatus of claim 14, wherein each output RF chain includes a bias circuit and an active gain element, and the bias circuit is configured to receive an enable signal and to output an output RF signal within the at least one band.

16. The apparatus of claim 15, wherein the active gain element is configured to be turned on by the bias circuit to process the first signal within the at least one band when the enable signal is received by the bias circuit.

* * * * *